US011150272B2

(12) United States Patent
Chahid et al.

(10) Patent No.: US 11,150,272 B2
(45) Date of Patent: Oct. 19, 2021

(54) METHOD FOR MEASURING A CURRENT, AND CURRENT-MEASURING DEVICE

(71) Applicant: Siemens Aktiengesellschaft, Munich (DE)

(72) Inventors: Abderrahim Chahid, Hemhofen (DE); Ingolf Hoffmann, Herzogenaurach (DE); Alexander Itzke, Nuremberg (DE); Roland Weiss, Erlangen (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 196 days.

(21) Appl. No.: 16/603,096

(22) PCT Filed: Apr. 4, 2018

(86) PCT No.: PCT/EP2018/058588
§ 371 (c)(1),
(2) Date: Oct. 4, 2019

(87) PCT Pub. No.: WO2018/185151
PCT Pub. Date: Oct. 11, 2018

(65) Prior Publication Data
US 2021/0255221 A1   Aug. 19, 2021

(30) Foreign Application Priority Data
Apr. 7, 2017   (EP) .................... 17165542

(51) Int. Cl.
*G01R 15/08* (2006.01)
*G01R 15/20* (2006.01)
*G01R 15/18* (2006.01)

(52) U.S. Cl.
CPC .......... *G01R 15/08* (2013.01); *G01R 15/185* (2013.01); *G01R 15/202* (2013.01)

(58) Field of Classification Search
None
See application file for complete search history.

(56) References Cited

U.S. PATENT DOCUMENTS 6,366,076 B1   4/2002   Karrer et al.
8,427,140 B2   4/2013   Hioka et al.
(Continued)

FOREIGN PATENT DOCUMENTS

CN   1036458 A     10/1989
CN   202305632 U   7/2012
(Continued)

OTHER PUBLICATIONS

Tumanski Slawomir: "Magnetic field sensors—Classification", Handbook of Magnetic Measurements, CRC Press, XP055417849, ISBN: 978-1-4398-2951-6, pp. 159-160, the whole document; 2011.
(Continued)

*Primary Examiner* — Jas A Sanghera
(74) *Attorney, Agent, or Firm* — Henry M. Feiereisen LLC

(57) ABSTRACT

In a method for measuring a current, a plurality of flux-gate field sensors is arranged with radial symmetry on a first circumferential path, and a plurality of Hall sensors is arranged with radial symmetry on a second circumferential path such that a one of the flux-gate field sensors is placed adjacent a one of the Hall sensors, with the flux-gate field sensors having a sensitivity which is higher by a factor 5 to 20 than a sensitivity of the Hall sensors. At least one of the plurality of flux-gate field sensors is evaluated so as to determine a current intensity, when two of the flux-gate field sensors generate measurement values within a measurement range, or at least one of the plurality of Hall sensors is evaluated so as to determine a current intensity, when the
(Continued)

measurement values of the two flux-gate field sensors are outside of the measurement range.

3 Claims, 2 Drawing Sheets

(56) References Cited

U.S. PATENT DOCUMENTS

| | | | |
|---|---|---|---|
| 2005/0156587 A1* | 7/2005 | Yakymyshyn | G01R 15/207 324/117 R |
| 2010/0001716 A1 | 1/2010 | Serpinet et al. | |
| 2013/0116955 A1 | 5/2013 | Williams | |
| 2014/0218018 A1 | 8/2014 | Ivanov et al. | |

FOREIGN PATENT DOCUMENTS

| | | |
|---|---|---|
| CN | 103091539 A | 5/2013 |
| CN | 106524981 A | 3/2017 |
| DE | 69526774 T2 | 11/2002 |
| RU | 2195677 C1 | 12/2002 |
| RU | 2234706 C1 | 8/2004 |
| RU | 2445638 C1 | 3/2012 |
| RU | 2453853 C2 | 6/2012 |
| WO | WO 2006010865 A1 | 2/2006 |
| WO | WO 2017-116615 A1 | 7/2017 |

OTHER PUBLICATIONS

Anonymous: "DRV425 Fluxgate Magentic-Field Sensor", XP055414701, gefunden im Internet: URL:http://www.ti.com/lit/ds/sbos729a/sbos729a.pdf, gefunden am Nov. 30, 2017, the whole docuement; 2016.

Lenz James et al; Magnetic sensors and their applications, IEEE Sensors Journal, vol. 6, No. 3, pp. 631-649, XP055417848, US, ISSN: 1530-437X, DOI: 10.1109/JSEN.2006.874493, the whole document; 2006.

PCT International Search Report and Written Opinion of International Searching Authority dated May 29, 2018 corresponding to PCT International Application No. PCT/EP2018/058588 filed Apr. 4, 2018.

* cited by examiner

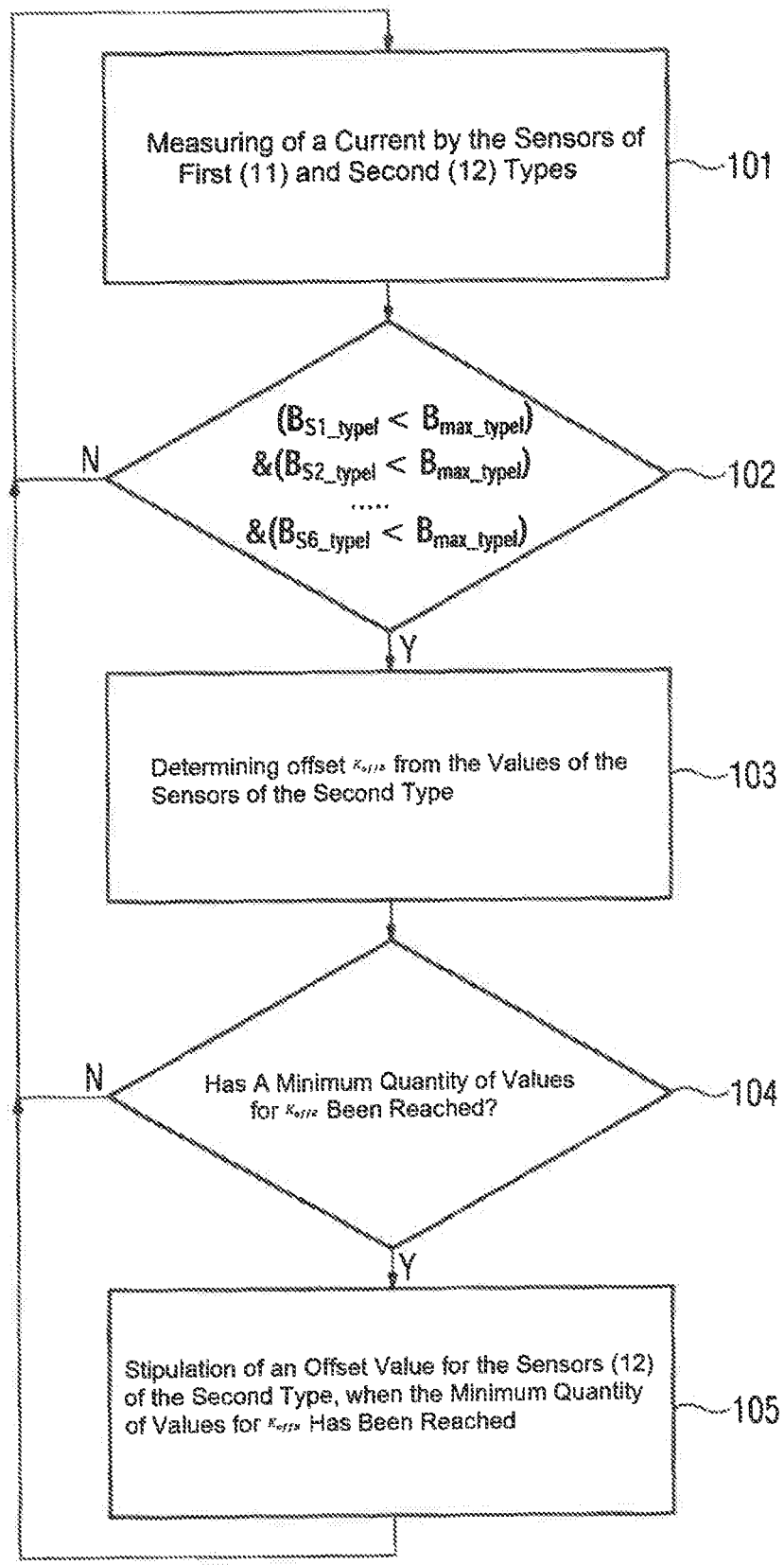

METHOD FOR MEASURING A CURRENT, AND CURRENT-MEASURING DEVICE

CROSS-REFERENCES TO RELATED APPLICATIONS

This application is the U.S. National Stage of International Application No. PCT/EP2018/058588, filed Apr. 4, 2018, which designated the United States and has been published as International Publication No. WO 2018/185151 A1 and which claims the priority of European Patent Application, Serial No. 17165542.6, filed Apr. 7, 2017, pursuant to 35 U.S.C. 119(a)-(d).

BACKGROUND OF THE INVENTION

The invention relates to a method for measuring a current by means of a current-measuring device.

Current-measuring devices, also referred to as current sensors, are used in order to measure or determine currents at specific points within electrical installations. In this context, a sensor arrangement for a current-measuring device and a corresponding evaluation method are considered, which enable an energy-efficient measurement of currents between 400 A and 10 kA without a flux concentrator (flux circuit). This sensor arrangement dispenses with a ferromagnetic circuit and enables an improved susceptibility to interference from the fields of parallel interfering conductors, as are common in a three-phase current system, by comparison with the prior art. Such current sensors may find use in converters for low and medium voltages or in battery monitoring. Primarily, converters for ship and rail drives or wind turbines move in this current range and are frequently constructed in such a compact manner that high external fields, but also superimposed internal fields (conductor rail feedback) are common at the current measurement site. Owing to the "open loop" operation, the measurement range of the sensor arrangement is limited by the measurement range of the individual sensor. Moreover, the magnetic field sensors, which possess the measurement range necessary for the maximum fields (approx. 50 mT), have a relatively great offset error of considerably above 1% of the maximum value. It is almost exclusively Hall sensors, known for their offset errors, which operate in this field range. Since the offset error of the individual sensors changes with the temperature and over time, an additional analog or digital offset stabilization is difficult.

Until now, the current has been measured e.g. using shunt resistors, toroids, Rogowski coils or individual field probes (Hall probe or GMR sensor). In the previously known measurement setups, the comparatively great offset error and the low accuracy associated therewith is accepted at low currents. It should be mentioned here that a simple direct compensation of the observed offset error is only possible with difficulty due to its non-deterministic time behavior and the significantly non-linear temperature behavior. The measurement range of the sensor arrangement resulted from the measurement range of the available individual sensors. Since the available Hall-technology sensors, with a measurement range of approx. 25 mT and greater, enable a very good accuracy and the MR technology available as an alternative only enables sensors with a measurement range up to 1 mT, for a long time there was a great gap in the measurement range for "chip-scale" magnetic field sensors. Moreover, the MR sensors decalibrated at fields of greater than approx. 20 mT to an extent that the accuracy is considerably deteriorated.

The invention is based on the object of specifying a current-measuring device which enables a higher accuracy when measuring a current.

SUMMARY OF THE INVENTION

This object is achieved by a method for measuring a current by means of a current-measuring device, wherein the current-measuring device has at least two sensors of a first type at least two sensors of a second type, wherein the sensors of the first type are flux-gate field sensors and the sensors of the second type are Hall sensors, wherein the sensors of the first type have a higher sensitivity than the sensors of the second type, wherein the first sensors are arranged with radial symmetry on a first circumferential path, in particular an ellipse or a first circular path, and the second sensors are arranged with radial symmetry on a second circumferential path, in particular an ellipse or a second circular path, wherein in each case a sensor of the first type is arranged adjacent to a sensor of the second type, wherein in order to determine the current intensity at least one of the sensors of the first type is evaluated, if the measurement values of at least two sensors of the first type lie within the measurement range and otherwise at least one sensor of the second type is evaluated.

Further advantageous embodiments of the invention are specified in the dependent claims.

The invention is based on the knowledge that the measurement accuracy of an annular arrangement of individual sensors is improved by sensors of different types being arranged at the measurement point or the measurement points in each case, such that the sensors on the one hand are as directly close to one another as possible and on the other hand all sensors of one type form an independent measurement arrangement which has the greatest possible radial symmetry. In this context, both sensors of different types are arranged adjacent to one another at a measurement point. This means that the spacing between them is lower than an extent of one of the sensors. In addition to an improvement of the measurement accuracy, it is also possible for the measurement range to be extended by this arrangement. In this context, the sensors of different types may be arranged adjacently in a tangential or radial manner.

Sensitivity, also referred to as resolution, is understood as the property of being able to capture a change in a measurement value. The higher the sensitivity, the smaller the changes of the measurement variable are able to be captured thereby.

The extension of the measurement range, as well as the increasing of the measurement accuracy by the current-measuring device, can be achieved by a method for measuring a current. In this context, these advantages can be achieved by an advantageous switching method between the sensors of different types. By way of examinations on the basis of real measurement data, taking into consideration interferences due to further current-carrying conductors, it is possible to shown that a type-based sensor switchover is superior to all other methods by a significant extent. The type-based sensor switchover takes place in such a manner that all sensors of the first type with a high sensitivity are then always used to calculate the current value, if a plurality of sensors, i.e. at least two sensors, of the first type supply individual valid values within its measurement range in each case. In this context, individual valid measurement values are those which lie within the permissible measurement range of the sensor. Otherwise, the sensors of the second type are always used to calculate the current value. This means, if at least two sensors of the first type are situated within its magnetic field measurement range simultaneously, then the signals of the sensors of the first type are used to calculate the current; otherwise, the signals of the sensors of the second type are used to calculate the current.

Here, the sensors of the first type and of the second type in each case form two concentric annular arrangements of sensors with parallel orientation of the field-sensitive direction. If an individual sensor is overloaded, however, no switchover takes place in terms of sensors. In order to achieve good measurement results, a type-based switchover is carried out. The advantages of this method lie in an extension of the measurement range, a general increase in the accuracy and a possible reduction of the offset error.

The sensors of the first type are flux-gate field sensors and the sensors of the second type are Hall sensors. These sensors are available on the market at a reasonable cost. Moreover, the installation size thereof is accordingly small, meaning that they can be integrated into a measuring device in a simple manner.

The person skilled in the art knows, as described in the freely accessible encyclopedia Wikipedia for example, that the measurement range is the range of a measurement variable in which the measurement deviations lie within stipulated boundaries. The stipulated error boundaries are only valid in the defined measurement range. Beyond the measurement range, nothing is guaranteed in terms of accuracy. Even in flux-gate field sensors and Hall sensors, the measurement range is specified in the data sheet.

In one advantageous embodiment of the invention, the sensors of the first type have a sensitivity which is higher by the factor 5 to 20 compared to the sensors of the second type. It has been shown that this enables a particularly low offset error to be achieved. If the sensitivity of the sensors of the first type is greater by the factor of 5 to 20 compared to the sensors of the second type, then a very low offset error can be achieved in practice in relation to the measurement range. Thus, the measurement ranges of the individual sensors of different types can be staggered in a sensible manner, in order to keep the measurement error low.

In a further advantageous embodiment of the invention, in order to determine the current intensity, at least one of the sensors of the first type is evaluated, if the measurement values of all sensors of the first type lie within the measurement range and otherwise at least one of the sensors of the second type is evaluated.

This means that as soon as a measurement value of one of the sensors of the first type leaves its measurement range, the current is calculated by at least one sensor of the second type, in particular by a weighted sum across the sensors of the second type. Only if the measurement values of all sensors of the first type originate from the valid range, will the current value be calculated across at least one of the sensors of the first type, in particular via a weighted sum across the sensors of the first type. Thus, all sensors contribute to the improved determination of a current and a measurement value can be determined with particularly high accuracy.

In a further advantageous embodiment of the invention, during the determination of the current intensity by the sensors of the first type, a correction value for the offset of the sensors of the second type is ascertained as a function of the measurement values from the sensors of the second type, in particular additionally as a function of the current intensity determined by the sensors of the first type. If the valid current value of the sensors of the first type is presently being calculated, then the current of the sensors of the second type is also calculated in parallel in a type of additional calculation. In this context, the calculation can take place in both, and in one of the cases, via a weighted sum of the measurement values of the individual sensors. From this, a prevailing correction value for the offset of the sensor arrangement of the second type is then ascertained. Here, the current measured by the sensors of the second type is determined as $$I_{type\ II} = \Sigma a_j^{type\ II} \cdot S_j^{type\ II} - I_{off,II} - \overline{K_{off,II}}.$$

An individual value for the correction factor results from this as $$K_{off,II} = \Sigma a_j^{type\ II} \cdot S_j^{type\ II} - I_{off,II} - (\Sigma a_j^{type\ I} \cdot S_j^{type\ I} - I_{off,I}).$$

Advantageously, the correction value for the offset of the sensor arrangement of the second type $K_{off,II}$ is ascertained in a greatest possible range of valid values of the sensor arrangement of the first type. For the correction of the current value with the valid calculation over the weighted sum across the sensors of the second type, the average value of the final correction values are then used for the offset of the sensor arrangement of the second type $K_{off,II}$.

BRIEF DESCRIPTION OF THE DRAWING

The invention is described and explained in more detail below on the basis of the exemplary embodiments shown in the figures, in which:

FIG. 3 shows a possible implementation of a method for offset correction.

DETAILED DESCRIPTION OF PREFERRED EMBODIMENTS

Figure 1:
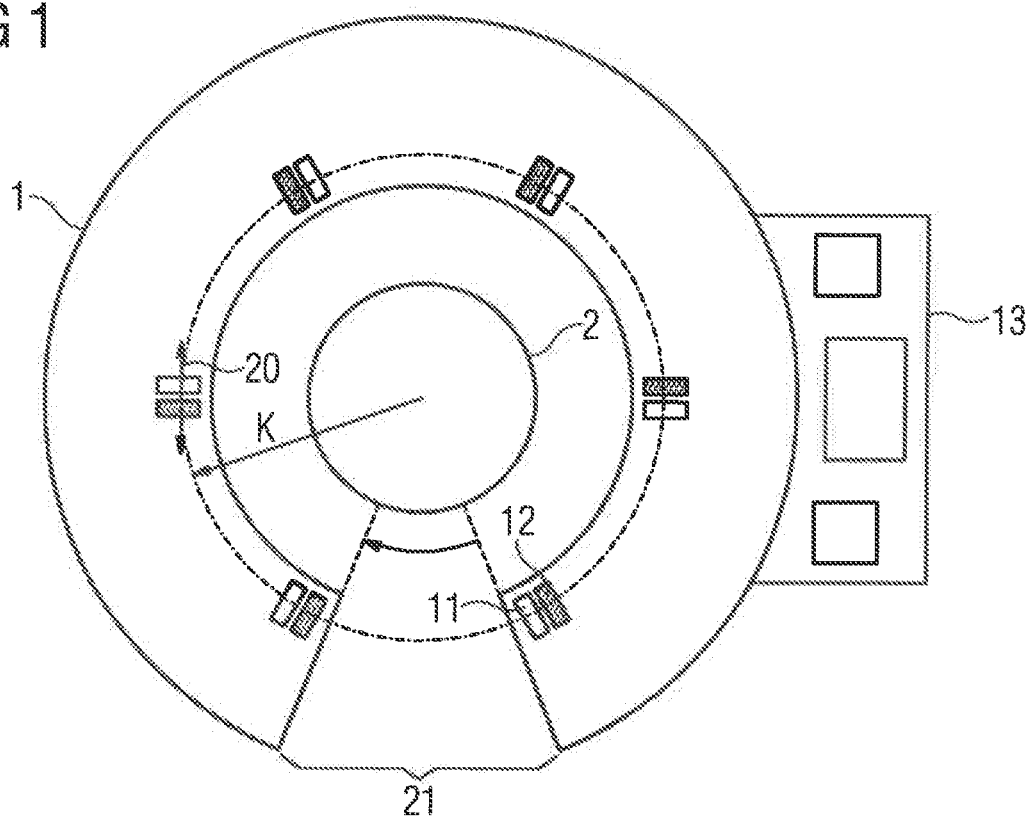
FIG. 1 shows a first exemplary embodiment of a current-measuring device.

FIG. 1 shows a first exemplary embodiment of a current-measuring device 1 around an electrical conductor 2. Here, the current-measuring device 1 has a multiplicity of sensors 11 of a first type and, adjacent to this in each case, a plurality of sensors 12 of a second type. In this exemplary embodiment, adjacent means that the spacing between two sensors is smaller than the smallest extent of the sensors. The types differ, for example, in their measuring principles in this context. The sensors of different types are arranged on a common circular path K. In this context, the arrangement takes place such that the field orientation 20 which can be measured by the respective sensor is oriented tangentially to the circular path. In order to be able to evaluate the measurement signals of the individual sensors, the current-measuring device 1 has an evaluation electronics unit 13. In order to arrange the measuring device 1 around the electrical conductor in a simple manner, it has proved advantageous in the circular construction of the current-measuring device 1 to provide an angular opening 21. The more flexible the current-measuring device 1, the smaller it is possible to embody the angular opening 21.

Figure 2:
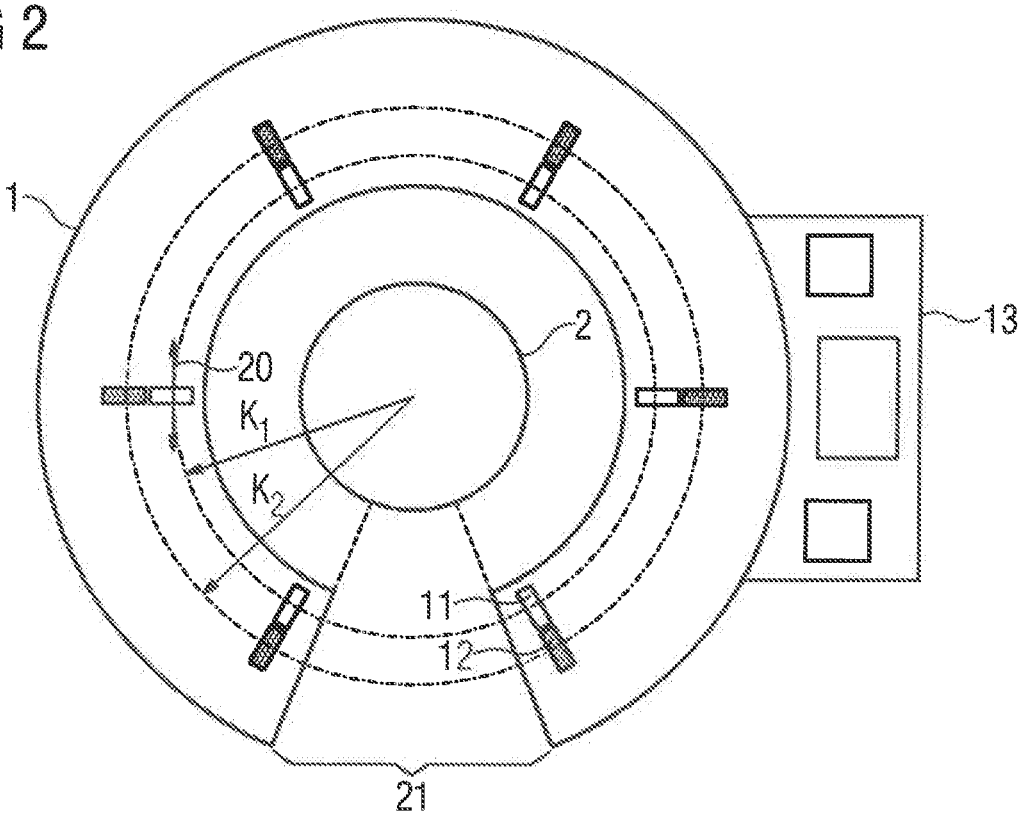
FIG. 2 shows a second exemplary embodiment of a current-measuring device.

FIG. 2 shows a further exemplary embodiment of the current-measuring device 1. For the avoidance of repetition, reference is made to the description relating to FIG. 1 and to the reference characters introduced there. In this exemplary embodiment, the sensors of the different types are in each case arranged adjacently on different, concentric circular paths $K_1$, $K_2$. In this exemplary embodiment, adjacent means that the spacing between two sensors is smaller than the smallest extent of the sensors. In this arrangement too, it is possible for a comparably good measurement result to be achieved, as in the construction of the exemplary embodiment explained above.

FIG. 3 shows a flow diagram for an advantageous measurement method for an offset correction. In a first step 101, the measuring of a current takes place by way of the sensors of the first and the second type. In a decision 102, it is checked whether all measurement values of the sensors of the first type are situated in the permitted measurement range. If this is not the case, then the method returns to the first step 101 in the path N (for "no") and new measurement values are recorded. In the other case Y (for "yes"), in which the measurement values of the sensors of the first type then lie in the permitted range, the offset $K_{offB}$ is determined from the values of the sensors 12 of the second type in step 103. Only when a minimum quantity of values for $K_{offB}$ is reached, is an offset value for the sensors of the second type stipulated in step 105. Otherwise, the decision 104 ensures that the method continues with the determination of new measurement values in step 101 once more.

In summary, the invention relates to a current-measuring device. In order to improve the measurement accuracy, it is proposed that the current-measuring device has at least two sensors of a first type and at least two sensors of a second type, wherein the sensors of the first type have a higher sensitivity than the sensors of the second type, wherein the first sensors are arranged with radial symmetry on a first circular path and the second sensors are arranged with radial symmetry on a second circular path, wherein in each case a sensor of the first type is arranged adjacent to a sensor of the second type. The invention further relates to a method for measuring a current by means of such a current-measuring device, wherein in order to determine the current intensity at least one of the sensors of the first type is evaluated, if the measurement values of at least two sensors of the first type lie within the measurement range and otherwise at least one sensor of the second type is evaluated.

What is claimed is:

1. A method for measuring a current, said method comprising:
   arranging a plurality of flux-gate field sensors with radial symmetry on a first circumferential path;
   arranging a plurality of Hall sensors with radial symmetry on a second circumferential path such that a one of the flux-gate field sensors is placed adjacent a one of the Hall sensors, with the flux-gate field sensors having a sensitivity which is higher by a factor 5 to 20 than a sensitivity of the Hall sensors; and
   evaluating at least one of the plurality of flux-gate field sensors so as to determine a current intensity, when two of the flux-gate field sensors generate measurement values within a measurement range, or
   evaluating at least one of the plurality of Hall sensors so as to determine a current intensity, when the measurement values of the two flux-gate field sensors are outside of the measurement range.

2. The method of claim 1, wherein the at least one of the plurality of flux-gate field sensors is evaluated, when the measurement values of all flux-gate field of the plurality of flux-gate field sensors lie within the measurement range, and when not affirmative, evaluating all Hall sensors of the plurality of Hall sensors to determine the current intensity.

3. The method of claim 1, further comprising ascertaining during determination of the current intensity by the at least one of the plurality of flux-gate field sensors a correction value for an offset of the Hall sensor as a function of the current intensity determined by the flux-gate field sensors.

* * * * *